United States Patent
Tang et al.

(10) Patent No.: US 11,049,958 B2
(45) Date of Patent: Jun. 29, 2021

(54) SEMICONDUCTOR POWER DEVICE AND MANUFACTURING METHOD THEREOF

(71) Applicant: SUPER GROUP SEMICONDUCTOR CO., LTD., Hsinchu County (TW)

(72) Inventors: Sung-Nien Tang, Hsinchu County (TW); Ho-Tai Chen, Hsinchu County (TW); Hsiu-Wen Hsu, Hsinchu County (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 0 days.

(21) Appl. No.: 16/504,393

(22) Filed: Jul. 8, 2019

(65) Prior Publication Data
US 2020/0027968 A1    Jan. 23, 2020

(30) Foreign Application Priority Data
Jul. 18, 2018    (TW) .................................. 10712478

(51) Int. Cl.
*H01L 29/66* (2006.01)
*H01L 29/06* (2006.01)
*H01L 21/768* (2006.01)

(52) U.S. Cl.
CPC ...... *H01L 29/66719* (2013.01); *H01L 29/665* (2013.01); *H01L 29/6656* (2013.01); *H01L 21/76838* (2013.01); *H01L 29/0696* (2013.01)

(58) Field of Classification Search
CPC ............. H01L 29/66719; H01L 29/665; H01L 29/6656; H01L 21/76838; H01L 29/0696
See application file for complete search history.

(56) References Cited

U.S. PATENT DOCUMENTS

| | | | |
|---|---|---|---|
| 2003/0181005 A1* | 9/2003 | Hachimine | H01L 21/823807 438/231 |
| 2006/0065914 A1* | 3/2006 | Chen | H01L 29/66636 257/288 |
| 2008/0224210 A1* | 9/2008 | Cai | H01L 29/66568 257/338 |
| 2013/0020623 A1* | 1/2013 | Tsui | H01L 27/11529 257/300 |
| 2014/0159139 A1* | 6/2014 | Chuang | H01L 29/7816 257/327 |
| 2018/0047754 A1* | 2/2018 | Basker | H01L 29/66795 |

* cited by examiner

*Primary Examiner* — Fernando L Toledo
*Assistant Examiner* — Neil R Prasad
(74) *Attorney, Agent, or Firm* — Li & Cai Intellectual Property (USA) Office

(57) ABSTRACT

A semiconductor power device and a manufacturing method thereof are provided. In the manufacturing method, before the self-aligned silicide process is performed, a gate stacked structure and a spacer are formed on a semiconductor layer having a body region and a source region. The spacer defines a portion of the source region for forming a silicide layer. Subsequently, the self-aligned silicide process is performed with the gate stacked structure and the spacer functioning as a mask to form the silicide layer at the defined portion of the source region. Thereafter, an interconnection structure including an interlayer dielectric layer and a source conductive layer is formed on the semiconductor layer. The source conductive layer is electrically connected to the source region. The silicide layer extends toward the gate stacked structure from a position under the source conductive layer to another position under the interlayer dielectric layer.

10 Claims, 10 Drawing Sheets

SEMICONDUCTOR POWER DEVICE AND MANUFACTURING METHOD THEREOF

CROSS-REFERENCE TO RELATED PATENT APPLICATION

This application claims the benefit of priority to Taiwan Patent Application No. 107124782, filed on Jul. 18, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a semiconductor power device and a manufacturing method thereof, and more particularly to a vertical double-diffused MOSFET and a manufacturing method thereof.

BACKGROUND OF THE DISCLOSURE

For conventional semiconductor power devices, such as lateral double-diffused MOSFET (LDMOSFET), or vertical double-diffused MOSFET (VDMOSFET), the breakdown voltage and on-resistance are important factors. For example, the conducting loss of the semiconductor power device is affected by the on-resistance.

With the vertical double-diffused MOSFET as an example, in order to reduce the on-resistance, the drift region of the semiconductor power device may have a higher carrier concentration. However, the higher carrier concentration may result in a lower breakdown voltage of the semiconductor power device.

SUMMARY OF THE DISCLOSURE

In response to the above-referenced technical inadequacies, the present disclosure provides a semiconductor power device and a manufacturing method thereof, so that the on-resistance can be reduced without affecting the breakdown voltage of the semiconductor power device.

In one aspect, the present disclosure provides a manufacturing method of a semiconductor power device. A semiconductor layer is formed on a substrate, in which the semiconductor layer includes a body region and a source region formed therein, and the source region is located in the body region and connected to an upper surface of the semiconductor layer, and an edge of the source region and an edge of the body region jointly define a channel region therebetween. Thereafter, a gate stacked structure overlapping with the channel region in a vertical direction is formed on the semiconductor layer. A spacer is formed to cover a sidewall of the gate stacked structure and a portion of the source region, and another portion of the source region is exposed from the upper surface. A self-aligned silicide process with the spacer and the gate stacked structure functioning as a mask is performed so as to form a silicide layer at the exposed portion of the source region. An interconnection structure is formed on the semiconductor layer, and the interconnection structure includes an interlayer dielectric layer and a source conductive layer electrically connected to the source region. The silicide layer extends from a position under the source conductive layer toward the gate stacked structure to another position under the interlayer dielectric layer.

In one aspect, the present disclosure provides a semiconductor power device. The semiconductor power device includes a substrate, a semiconductor layer, a gate stacked structure, a spacer, a silicide layer, and an interconnection structure. The semiconductor layer is disposed on the substrate and includes a body region and a source region formed therein. The source region is connected to an upper surface of the semiconductor layer, and a channel region is defined between an edge of the source region and an edge of the body region. The gate stacked structure is disposed on the upper surface of the semiconductor layer and overlaps with the channel region in a vertical direction. The spacer is disposed on the semiconductor layer and covers a sidewall of the gate stacked structure and a portion of the source region. The silicide layer is in contact with the source region. The interconnection structure includes an interlayer dielectric layer and a source conductive layer. The interlayer dielectric layer has at least one source contact opening, and the source conductive layer is disposed on the interlayer dielectric layer and electrically in contact with the silicide layer through the source contact opening so as to be electrically connected to the source region. The silicide layer extends from a position under the source conductor layer toward the gate stacked structure to another position under the interlayer dielectric layer.

Therefore, in the semiconductor power device and the manufacturing method thereof provided in the present disclosure, by the technical feature of "before the formation of the interconnection structure, the spacer is formed and the self-aligned silicide process is performed," a shortest distance between the silicide layer and the channel region can be decreased. Since the resistance of the silicide layer is usually lower than that of the source region, the on-resistance of the semiconductor power device can be further reduced due to the decreased shortest distance between the silicide layer and the channel region.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
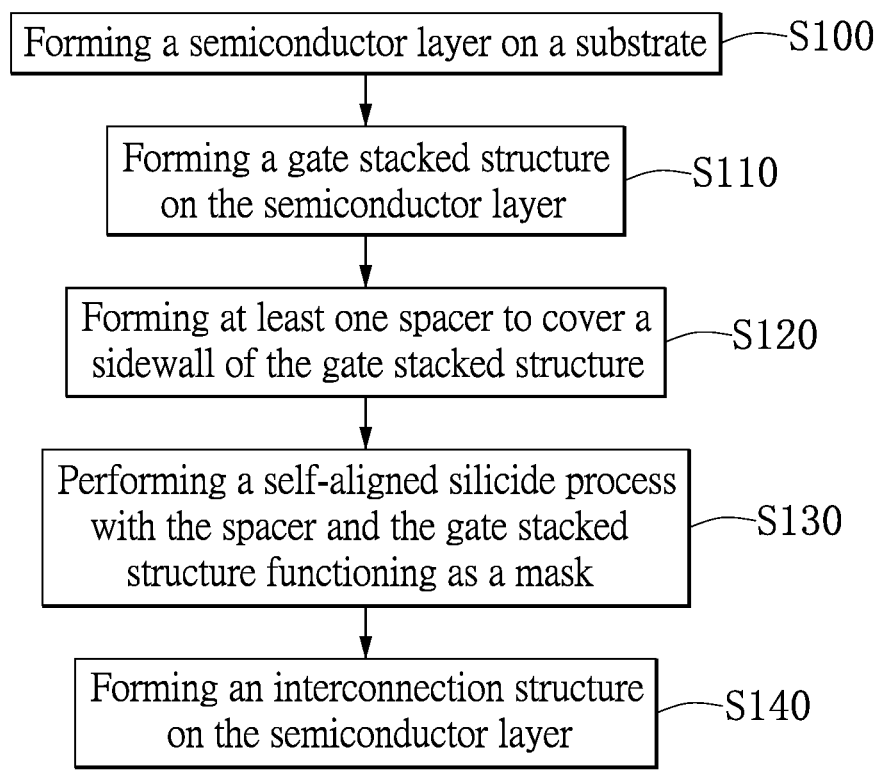
FIG. 1 is a flowchart of a manufacturing method of a semiconductor power device according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a flowchart of a manufacturing method of a semiconductor power device according to an embodiment of the present disclosure.

In step S100, a semiconductor layer is formed on a substrate. In step S110, a gate stacked structure is formed on the semiconductor layer. In step S120, a spacer is formed to cover a sidewall of the gate stacked structure. In step S130, a self-aligned silicide process is performed with the spacer and the gate stacked structure functioning as a mask to form a silicide layer in contact with a source region of the semiconductor layer. In step S140, an interconnection structure is formed on the semiconductor layer.

As mentioned above, in the present embodiment, before the step of forming the interconnection structure, the spacer covering the sidewall of the gate stacked structure is formed and the self-aligned silicide process is performed. Details of the manufacturing method of a semiconductor power device will be described in the following description.

Figure 2A:
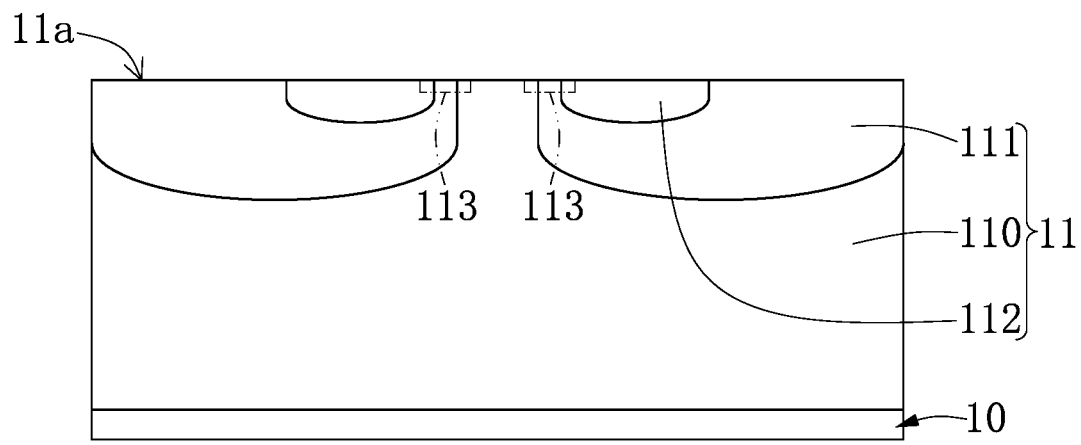
FIG. 2A is a schematic sectional view of a semiconductor power device in one of the steps according to an embodiment of the present disclosure.

Reference is made to FIG. 1 and FIG. 2A, in which FIG. 2A is a schematic sectional view partially showing a semiconductor power device in step S100 according to an embodiment of the present disclosure.

The semiconductor layer 11 is disposed on the substrate 10 and has an upper surface 11a located at a side thereof opposite to the substrate 10.

The substrate 10 is heavily doped with the first conductivity type impurities to serve as a drain of the semiconductor power device. The first conductivity type impurities can be n- or p-type conductivity impurities. The substrate 10 can be made of a semiconductor material, such as silicon, silicon carbide, or the like. Assuming that the substrate 10 is a silicon carbide substrate, the n-type conductivity impurities may be Group V ions such as phosphorus ions or arsenic ions, and the p-type conductivity impurities may be Group III ions such as boron ions, aluminum ions or gallium ions.

The material of the semiconductor layer 11 can be the same as that of the substrate 10 and has a conductivity type the same as that of the substrate 10. However, a doping concentration of the semiconductor layer 11 is lower than that of the substrate 10. With the N-type MOSFET (NMOS) as an example, the substrate 10 is a heavily N-type doped ($N^+$) substrate and the semiconductor layer 11 is a lightly N-type doped ($N^-$) layer. On the contrary, with the P-type MOSFET (PMOS) as an example, the substrate 10 is a heavily P-type doped ($P^+$) substrate and the semiconductor layer 11 is a lightly P-type doped ($P^-$) layer.

Compared to silicon, silicon carbide has a wider band gap and a better thermal conductivity. Furthermore, the semiconductor power device made from the silicon carbide has a faster switching speed, a lower power consumption and a higher withstand voltage. Therefore, in the instant embodiment, both the substrate 10 and the semiconductor layer 11 are made of silicon carbide.

It should be noted that the semiconductor layer 11 can be defined into a cell region and a termination region, and FIG. 2A partially shows a schematic sectional view of the cell region of the semiconductor power device.

Furthermore, in the embodiment shown in FIG. 2A, by respectively doping different impurities with different conductivity types and concentrations in different regions, the semiconductor layer 11 can be divided into a drift region 110, at least one body region 111, and at least one source region 112. The body region 111 and the source region 112 are located closer to the upper surface 11a of the semiconductor layer 11. That is, the body region 111 and the source region 112 are formed in an upper half part of the semiconductor layer 11.

In one embodiment, a body-doping process is performed on the semiconductor layer 11 so as to form the body region 111. The aforementioned body-doping process is performed by doping the second conductivity type impurities into the semiconductor layer 11. It should be noted that the body region 111 is located in the cell region and the termination region.

Subsequently, a source-doping process is performed so as to form the source region 112. The aforementioned source-doping process is performed by doping the first conductivity type high-concentration impurities in the body region 111, and a doping concentration of the source region 112 is higher than that of the body region 111.

That is to say, the source region 112 is formed in the body region 111, and located in the cell region. Furthermore, the source region 112 is separated from the drift region 110 by the body region 111 so as to define at least one channel region 113. To be more specific, the channel region 113 is located between one edge of the source region 112 and one edge of the body region 111, and is immediately adjacent to the upper surface 11a of the semiconductor layer 11.

As shown in FIG. 2A, two of the body regions 111 are spaced apart from each other by the drift region 110, and define two of the channel regions 113 respectively with two of the source regions 112, the two channel regions 113 being respectively formed in the two body regions 111.

Figure 2B:
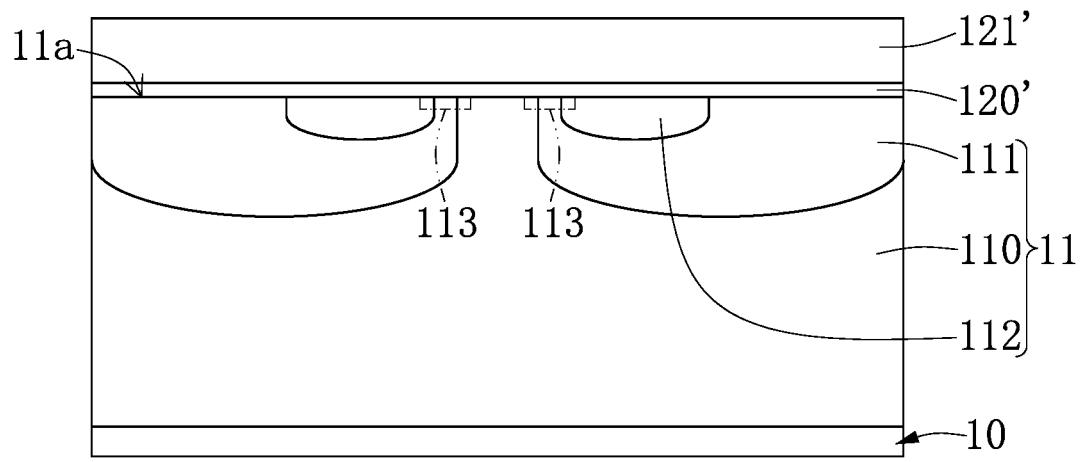
FIG. 2B is a schematic sectional view of a semiconductor power device in one of the steps according to an embodiment of the present disclosure.
Figure 2C:
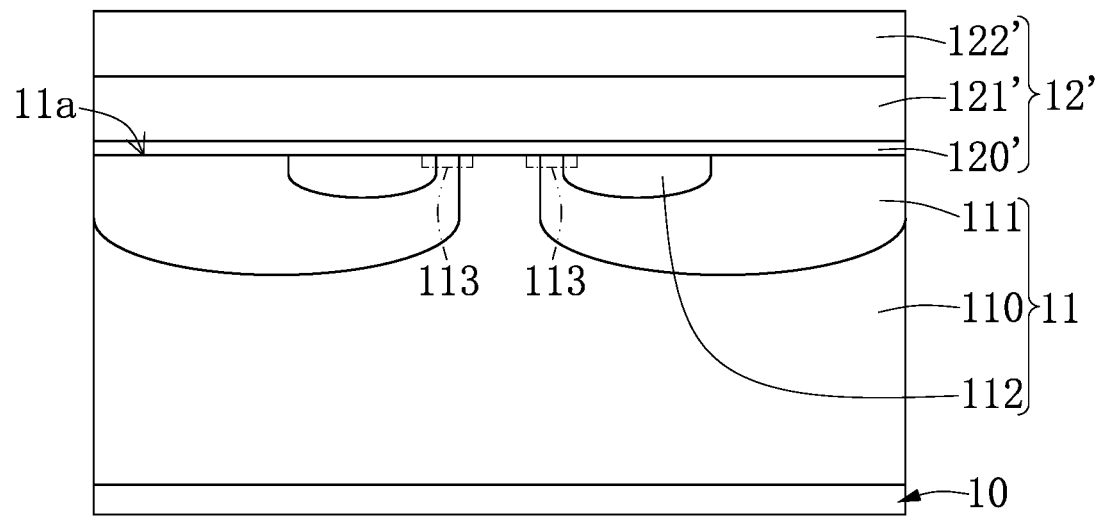
FIG. 2C is a schematic sectional view of a semiconductor power device in one of the steps according to an embodiment of the present disclosure.
Figure 2D:
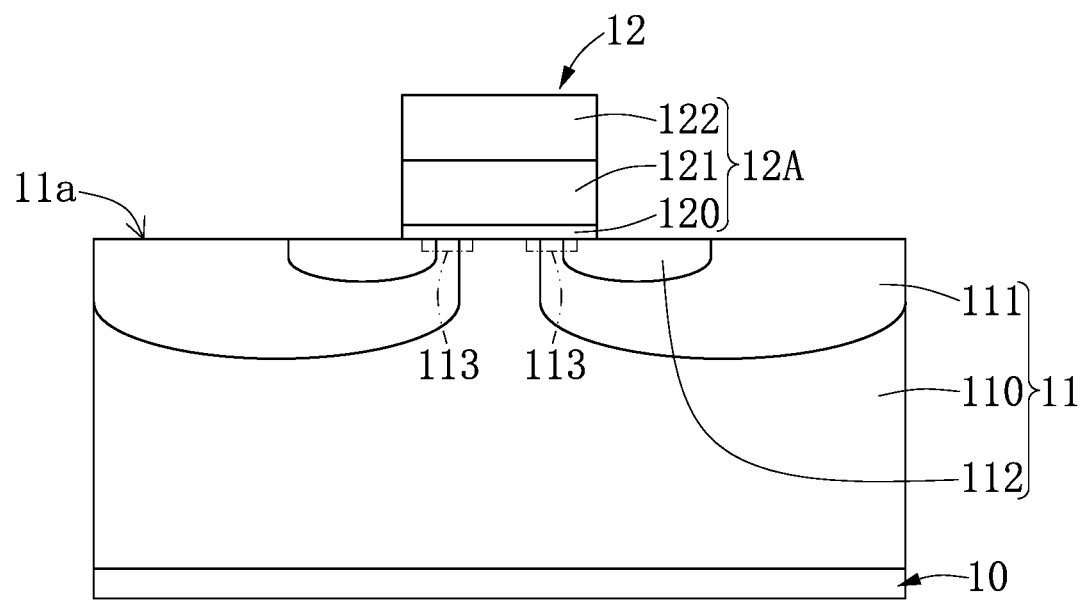
FIG. 2D is a schematic sectional view of a semiconductor power device in one of the steps according to an embodiment of the present disclosure.

Subsequently, the method proceeds to the step S110 shown in FIG. 1. Reference is made to FIG. 2B to FIG. 2D, which show the details of forming the gate stacked structure on the semiconductor layer 11 according to one embodiment of the present disclosure.

As shown in FIG. 2B, a gate insulating material layer 120' and an initial gate layer 121' are formed on the upper surface 11a of the semiconductor layer 11. Both of the gate insulating material layer 120' and the initial gate layer 121' completely cover the upper surface 11a of the semiconductor layer 11.

The material of the gate insulating material layer 120' can be nitride or oxide, such as silicon oxide, aluminum oxide, silicon nitride, silicon oxynitride (SiON), or other appropriate dielectric materials.

The initial gate layer 121' is formed on the gate insulating material layer 120' and insulated from the semiconductor layer 11 by the gate insulating material layer 120'. The material of the initial gate layer 121' is a conductive material, such as heavily-doped polysilicon, metal, or alloy. In one embodiment, the initial gate layer 121' has a thickness greater than a thickness of the gate insulating material layer 120'.

Reference is made to FIG. 2C. The manufacturing method of the present embodiment further includes a step of forming an initial mask layer 122' on the initial gate layer 121'. Accordingly, the gate insulating material layer 120', the initial gate layer 121', and the initial mask layer 122' jointly form an initial gate stacked structure 12'. The material of the initial mask layer 122' can be nitride or oxide, and is not limited in the present disclosure. In one embodiment, a thickness of the initial mask layer 122' is equal to or greater than that of the initial gate layer 121'.

Reference is made to FIG. 2D. The initial gate stacked structure 12' is patterned so as to form the gate stacked structure 12. It should be noted that the gate stacked structure 12 includes a first part 12A located in the cell region and a second part 12B located in the termination region. Accordingly, only a schematic sectional view of the first part 12A of the gate stacked structure 12 is shown in FIG. 2D for illustrative purposes.

Specifically, the gate stacked structure can be fabricated by performing a wet etching or dry etching on the gate insulating material layer 120', the initial gate layer 121', and the initial mask layer 122'.

Accordingly, the gate stacked structure 12 includes a gate insulating layer 120, a gate electrode 121, and a mask layer 122 covering the gate electrode 121. That is, after a portion of the gate insulating material layer 120' is removed by an etching process, the gate insulating layer 120 is formed. Similarly, the gate electrode 121 is formed by etching the initial gate layer 121', and the mask layer 122 is formed by etching the initial mask layer 122'. In the present embodiment, the gate insulating layer 120, the gate electrode 121, and the mask layer 122 have substantially the same width.

The gate stacked structure 12 partially overlaps with the source region 112 and the body region 111 in a vertical direction. As shown in FIG. 2D, two source regions 112 are respectively connected to two opposite sides of the gate stacked structure 12, and the gate stacked structure 12 overlaps with the two channel regions 112. To be more specific, the gate stacked structure 12 overlaps with each of the channel regions 113 in the vertical direction so as to turn on or off the semiconductor power device.

With the NMOS transistor as an example, when a positive bias is applied to the gate electrode 121, the electrons accumulate in the channel region 113 so that a current flowing through the channel region 113 is generated and the NMOS transistor is turned on. On the contrary, when a negative bias is applied to the gate electrode 121, the NMOS transistor is turned off.

Furthermore, the gate stacked structure 12 does not completely cover the source region 112 so that the source region 112 is partially exposed on the upper surface 11a of the semiconductor layer 11. Accordingly, the interconnection structure for electrically connecting the source region 112 and the gate electrode 121 to an external control circuit can be fabricated.

Figure 2E:
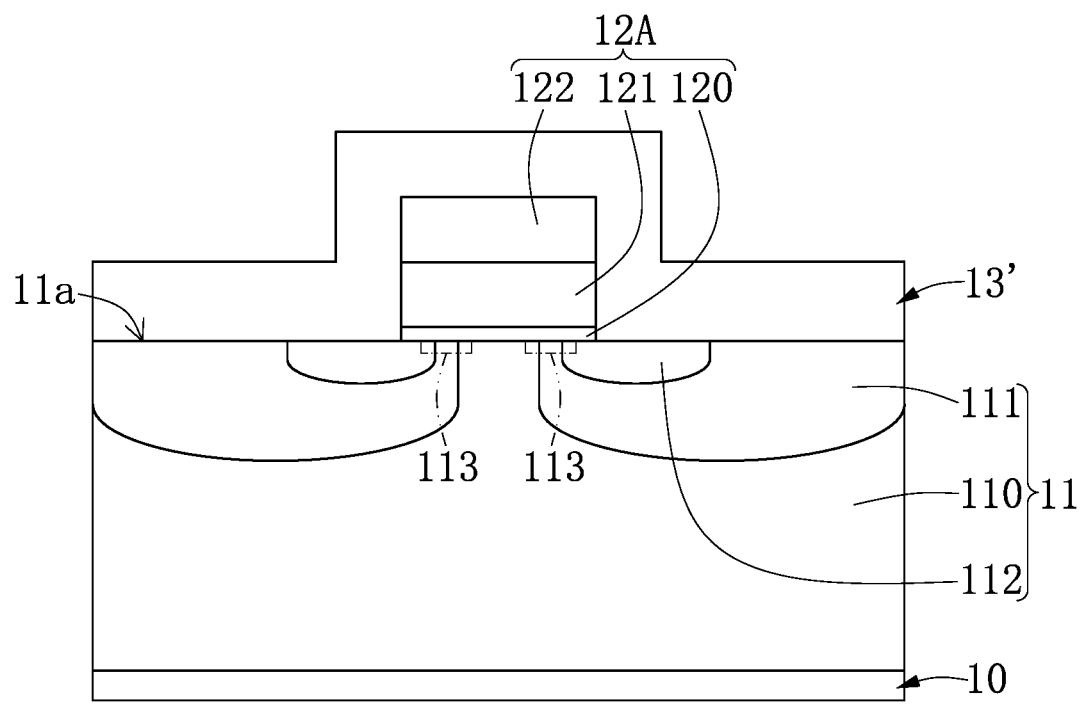
FIG. 2E is a schematic sectional view of a semiconductor power device in one of the steps according to an embodiment of the present disclosure.
Figure 2F:
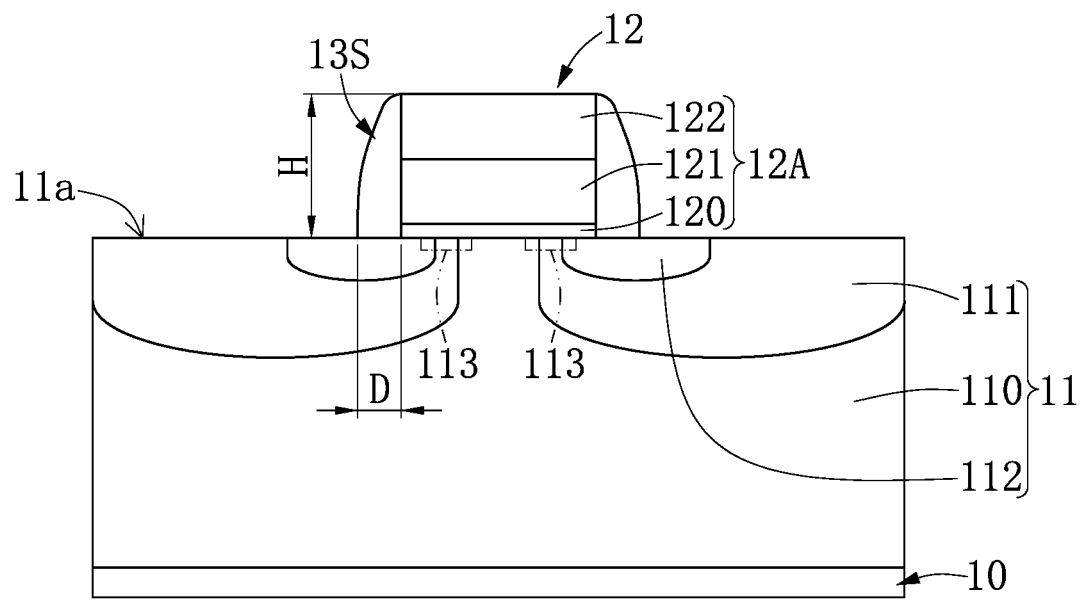
FIG. 2F is a schematic sectional view of a semiconductor power device in one of the steps according to an embodiment of the present disclosure.

Subsequently, the method proceeds to the step S120 shown in FIG. 1. Reference is made to FIG. 2E to FIG. 2F, which illustrate the details of forming the spacer. As shown in FIG. 2E, a dielectric material layer 13' covering the upper surface 11a of the semiconductor layer 11 and an outer surface (including the sidewalls and top surface) of the gate stacked structure 12 is formed.

The dielectric material layer 13' can be a nitride layer or an oxide layer, such as, but not limited to, a silicon oxide layer, a silicon nitride layer, a silicon oxynitride layer, and so on. Furthermore, the dielectric material layer 13' has a thickness ranging from 50 nm to 500 nm.

As shown in FIG. 2F, an etching step is performed to remove a portion of the dielectric material layer 13' which is located on the gate stacked structure 12 and located on the upper surface 11a so as to form the spacer 13S. Specifically, the portion of the dielectric material layer 13', which covers the top surface of the gate stacked structure 12 and covers the upper surface 11a of the semiconductor layer 11, is removed, and the remaining portion of the dielectric material layer 13', which covers the sidewall of the gate stacked structure 12, forms the spacer 13S.

In the instant embodiment, the self-aligned spacer 13S can be formed by performing a dry etching process. Since the etch rate in a downward direction is far faster than that in a sideward direction during the dry etching process, it ensures that the portion of the dielectric material layer which covers the sidewall of the gate stacked structure can remain during the removal of the portion of the dielectric material layer which covers the top surface of the gate stacked structure 12 and the upper surface 11a of the semiconductor layer 11.

Accordingly, the spacer 13S has a largest thickness D in a direction parallel to a width direction of the gate stacked structure 12, and the largest thickness D is substantially the same as the thickness of the dielectric material layer 13'. Accordingly, in one embodiment, the largest thickness D of the spacer 13S ranges from 50 nm to 500 nm. As shown in FIG. 2F, the spacer 13S has a largest height H, i.e., a vertical distance between a top end of the spacer 13 and the upper surface 11a of the semiconductor layer 11. In the present embodiment, the largest height H of the spacer 13S is substantially the same as a height of the gate stacked structure 12. Furthermore, the thickness of the spacer 13S in a direction parallel to the width direction of the gate stacked structure 12 gradually decreases along a direction from bottom to top. That is to say, the portion of the spacer 13S near the semiconductor layer 11 has a greater thickness than that of another portion of the spacer 13S distant from the semiconductor layer 11. The spacer 13S covers a portion of the source region 112, while another portion of the source region 112 is not covered by the spacer 13S and the gate stacked structure 12 and is exposed on the upper surface 11a of the semiconductor layer 11.

It should be noted that in the manufacturing method of the embodiment of the present disclosure, the positions where the silicide will be formed in the following steps can be defined by the formation of the spacers 13S. Reference is made to the step S130 shown in FIG. 1, along with FIG. 2G and FIG. 2H, which show the details of performing a self-aligned silicide process with the spacer 13S and the gate stacked structure 12 functioning as a mask.

Figure 2G:
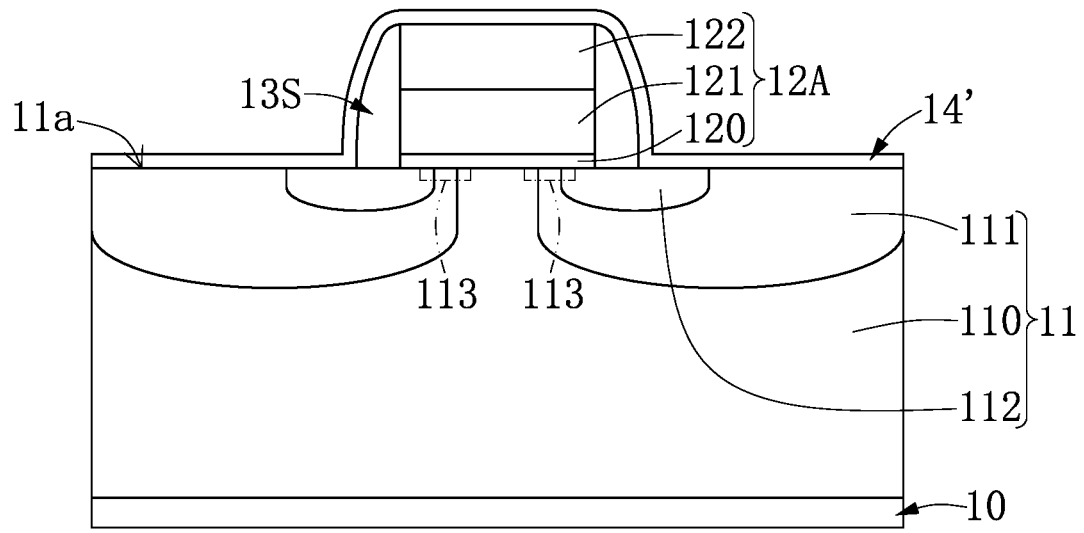
FIG. 2G is a schematic sectional view of a semiconductor power device in one of the steps according to an embodiment of the present disclosure.

As shown in FIG. 2G, a conductive layer 14' is formed to completely cover the upper surface 11a of the semiconductor layer 11, the spacer 13S and the gate stacked structure 12. The material of the conductive layer 14' can be tungsten, titanium, cobalt, tantalum, nickel, palladium, or any combination thereof.

Figure 2H:
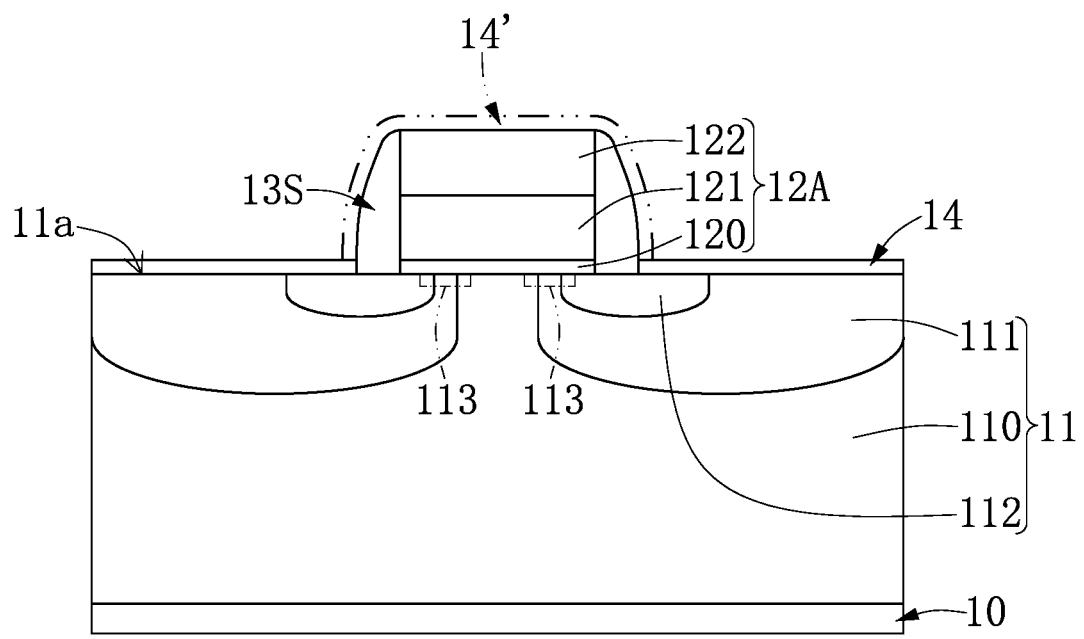
FIG. 2H is a schematic sectional view of a semiconductor power device in one of the steps according to an embodiment of the present disclosure.

As shown in FIG. 2H, a heat treatment is performed on the conductive layer 14' so that a portion of the conductive layer 14' reacts with the semiconductor layer 11 to form a silicide layer 14. Another portion of the conductive layer 14', which covers on the gate stacked structure 12 and the spacers 13S, does not react with the semiconductor layer 11. Accordingly, during the following step, the unreacted portion of the conductive layer 14' will be removed.

It should be noted that in one embodiment, the gate electrode 121 is made of heavily-doped polysilicon. If the conductive layer 14' is directly in contact with the gate electrode 121 so that a silicide reaction occurs between the conductive layer 14' and the gate electrode 121 during the heat treatment, the gate electrode 121 may be partially melted and deform due to the high temperature in the heat treatment.

Accordingly, in the instant embodiment, the conductive layer 14' covering the gate stacked structure 12 is isolated from the gate electrode 121 by the mask layer 122. As such, during the heat treatment, the mask layer 122 can prevent the gate electrode 121 from reacting with the conductive layer 14'. Reference is made to the step S140 shown in FIG. 1, FIG. 3A to FIG. 3D, and FIG. 4A to FIG. 4C, which shows the details of forming the interconnection structure on the semiconductor layer 11.

Figure 3A:
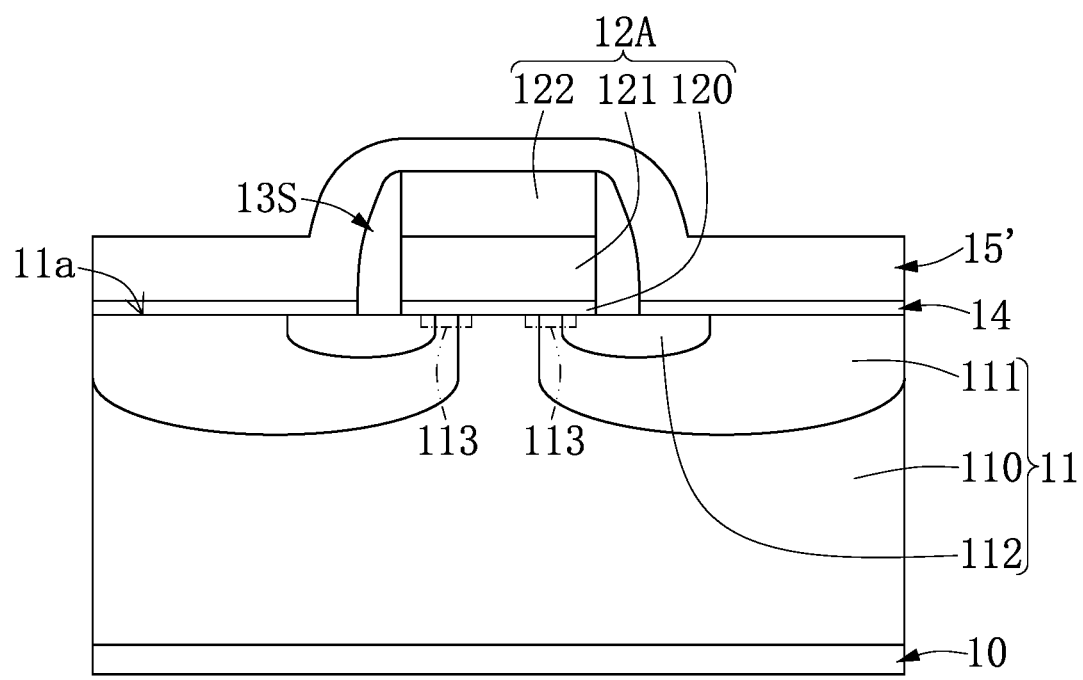
FIG. 3A is a schematic sectional view of a semiconductor power device in one of the steps according to an embodiment of the present disclosure.

Referring to FIG. 3A, an interlayer dielectric material layer 15' is formed to completely cover the silicide layer 14, the spacer 13S and the gate stacked structure 12. The material of the interlayer dielectric material layer 15' can be selected from a group consisting of borophosphosilicate glass (BPSG), phosphosilicate glass (PSG), oxide, nitride and any combination thereof.

Figure 3B:
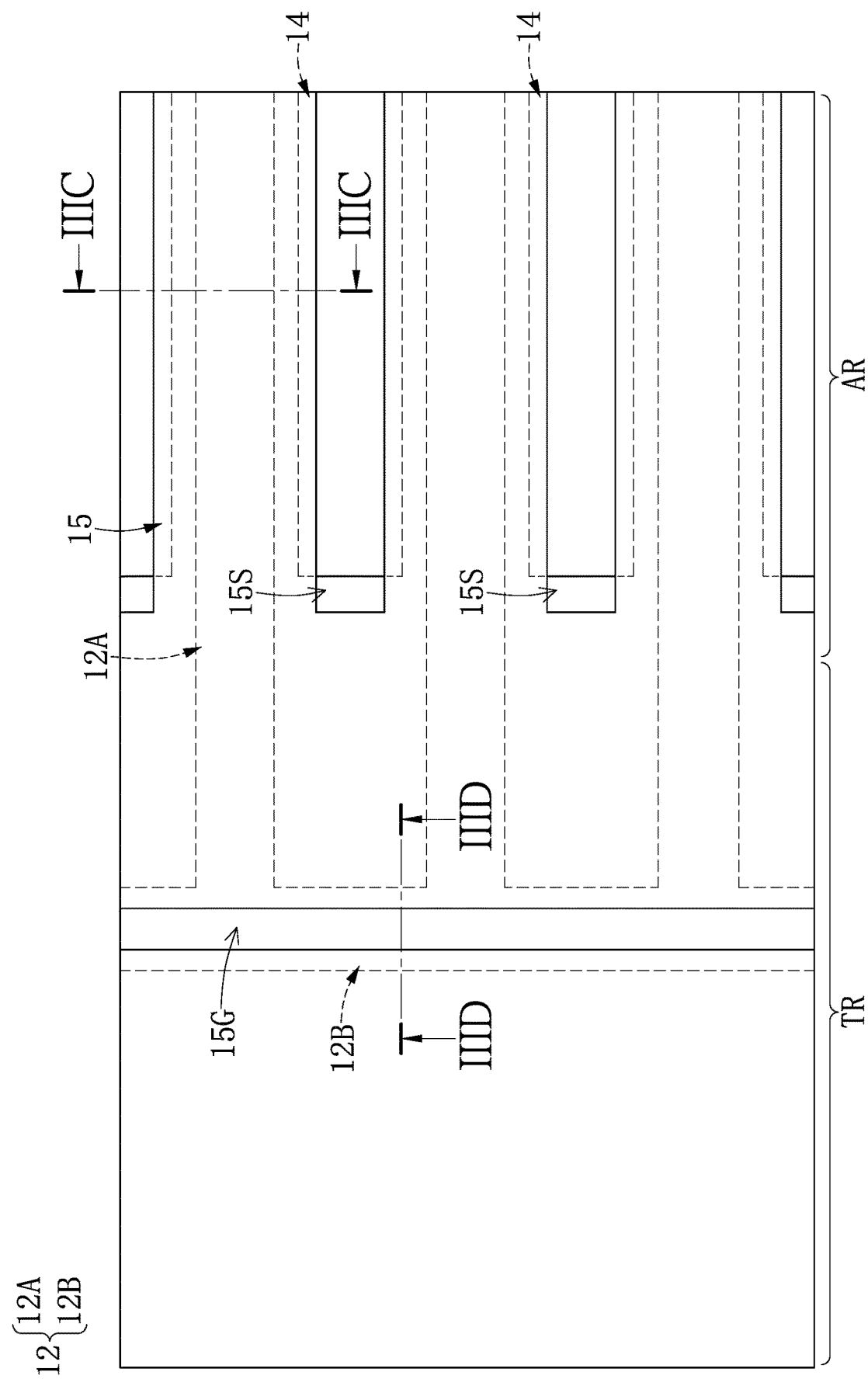
FIG. 3B is a schematic top view of a semiconductor power device in one of the steps according to an embodiment of the present disclosure.
Figure 3C:
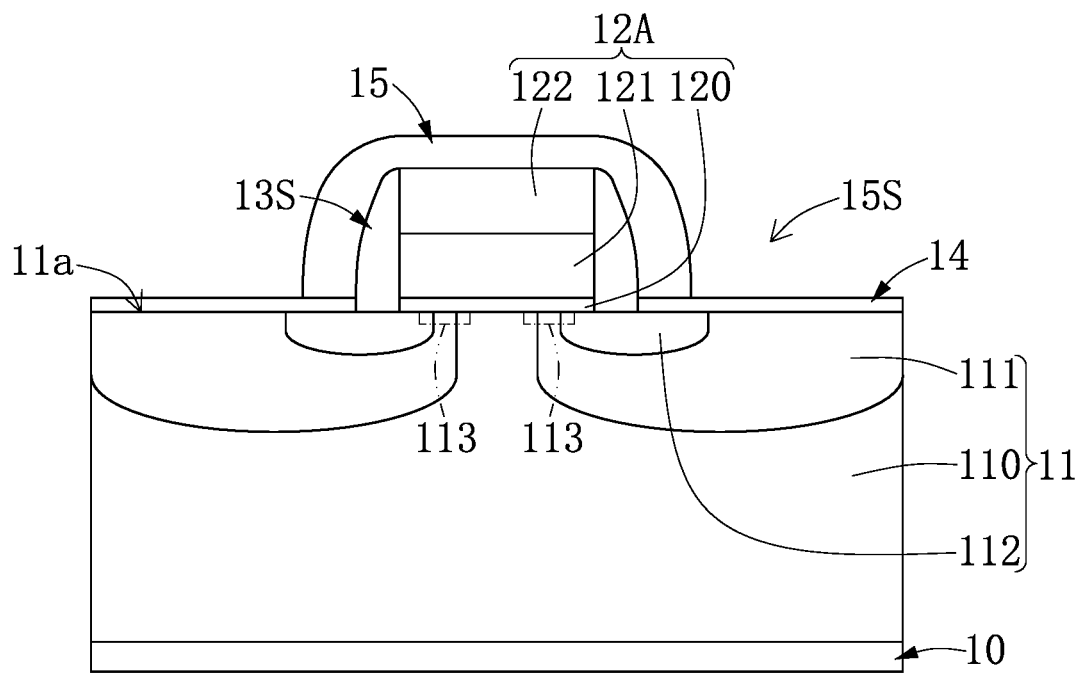
FIG. 3C is a cross-sectional view taken along a line IIIC-IIIC of FIG. 3B.
Figure 3D:
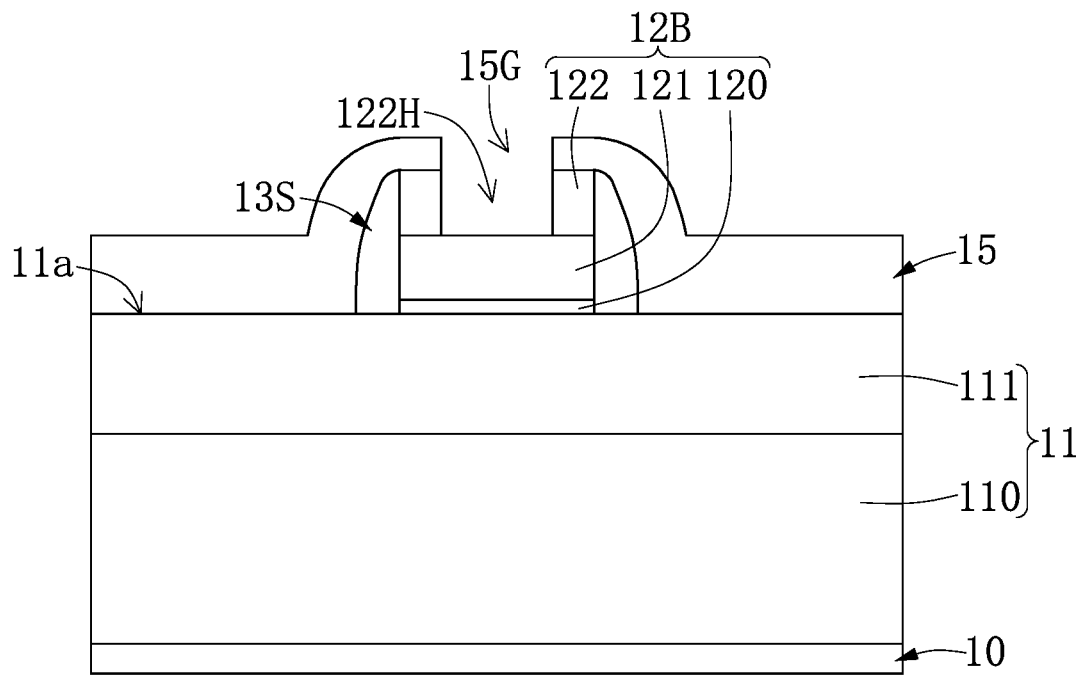
FIG. 3D is a cross-sectional view taken along a line IIID-IIID of FIG. 3B.

Reference is made to FIG. 3B to FIG. 3D. FIG. 3B is a schematic top view of a semiconductor power device in step S140 according to an embodiment of the present disclosure. FIG. 3C is a cross-sectional view taken along line IIIC-IIIC of FIG. 3B. FIG. 3D is a cross-sectional view taken along line IIID-IIID of FIG. 3B.

As mentioned previously, the semiconductor layer 11 is divided into the cell region AR and the termination region TR, and the gate stacked structure 12 includes the first part 12A located in the cell region AR and the second part 12B located in the termination region 12B, as shown in FIG. 3B.

Furthermore, the interlayer dielectric material layer 12' is patterned so as to form an interlayer dielectric layer 15 that has at least one source contact opening 15S and at least one gate contact opening 15G In one embodiment, both the source contact opening 15S and the gate contact opening 15G are formed during the step of patterning the interlayer dielectric material layer 15'.

Moreover, in the instant embodiment, the position of the gate contact opening 15G corresponds to a position of the second part 12B of the gate stacked structure 12. Accordingly, the gate contact opening 15G is located in the termination region TR. In another embodiment, the gate contact opening 15G can be located in the cell region AR.

As shown in FIG. 3B and FIG. 3C, the source contact opening 15S is located in the cell region AR so that the silicide layer 14 can be exposed through the source contact opening 15S. It should be noted that as long as the source region 112 and the gate electrode 121 can be electrically connected to the external control circuit, the positions of the source contact opening 15S and the gate contact opening 15G are not limited to the examples provided in the present disclosure.

Furthermore, as shown in FIG. 3B and FIG. 3D, after the interlayer dielectric material layer 15' is patterned, the manufacturing method of the embodiment of the present disclosure further includes a step of removing a portion of mask layer 122 through the gate contact opening 15G so as to expose the gate electrode 121. That is to say, the mask layer 122 has an extending hole 122H that is in spatial communication with the gate contact opening 15G.

Figure 4A:
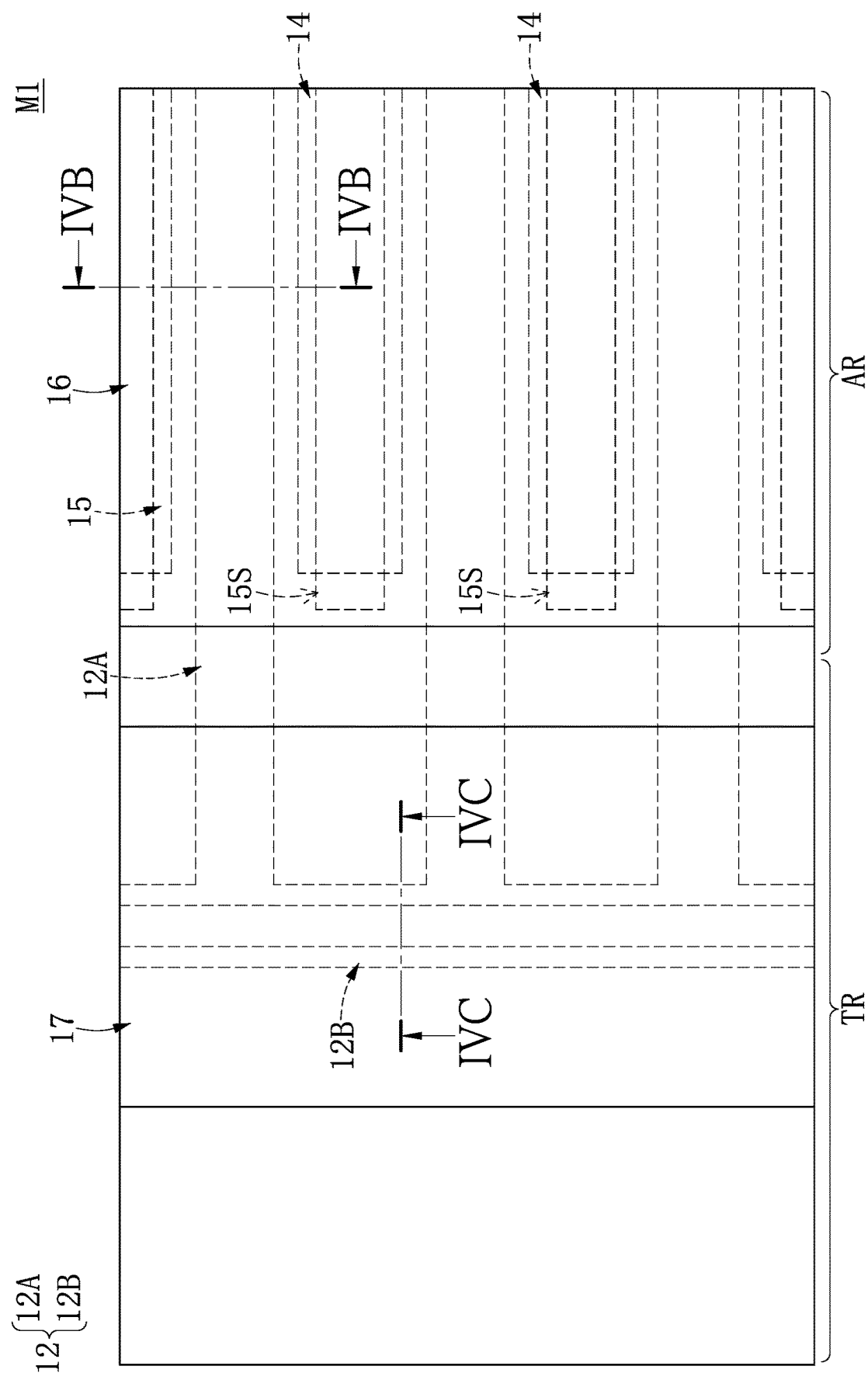
FIG. 4A is a schematic top view partially showing a semiconductor power device in one of the steps according to an embodiment of the present disclosure.
Figure 4B:
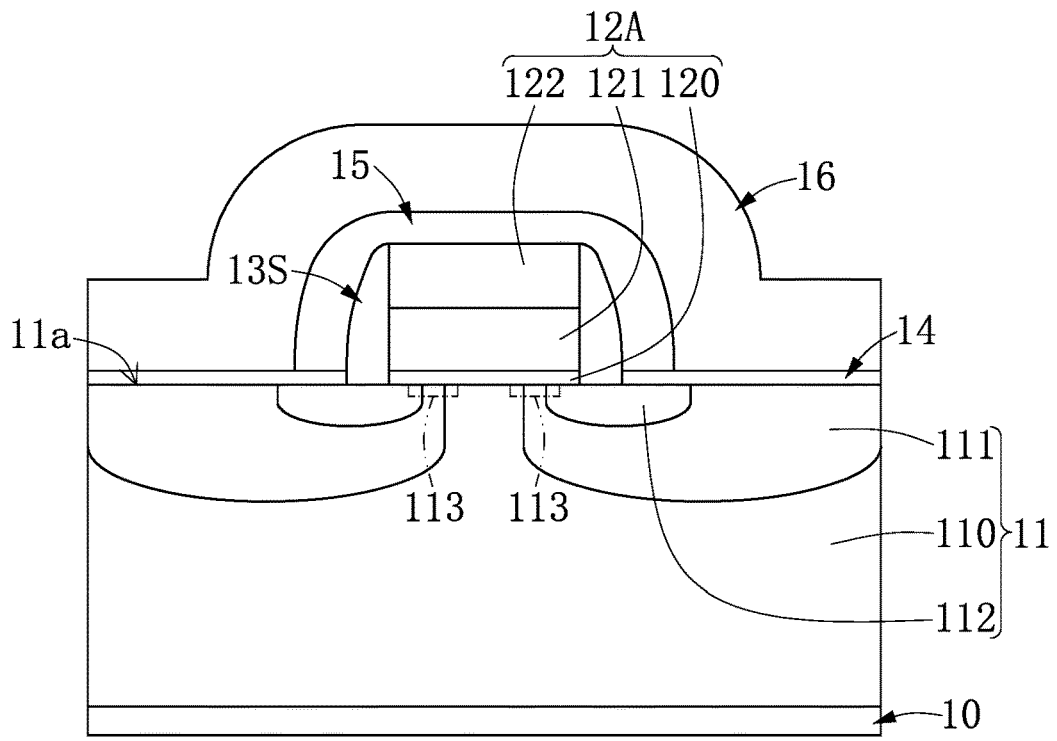
FIG. 4B is a schematic cross-sectional view taken along a line IVB-IVB of FIG. 4A.
Figure 4C:
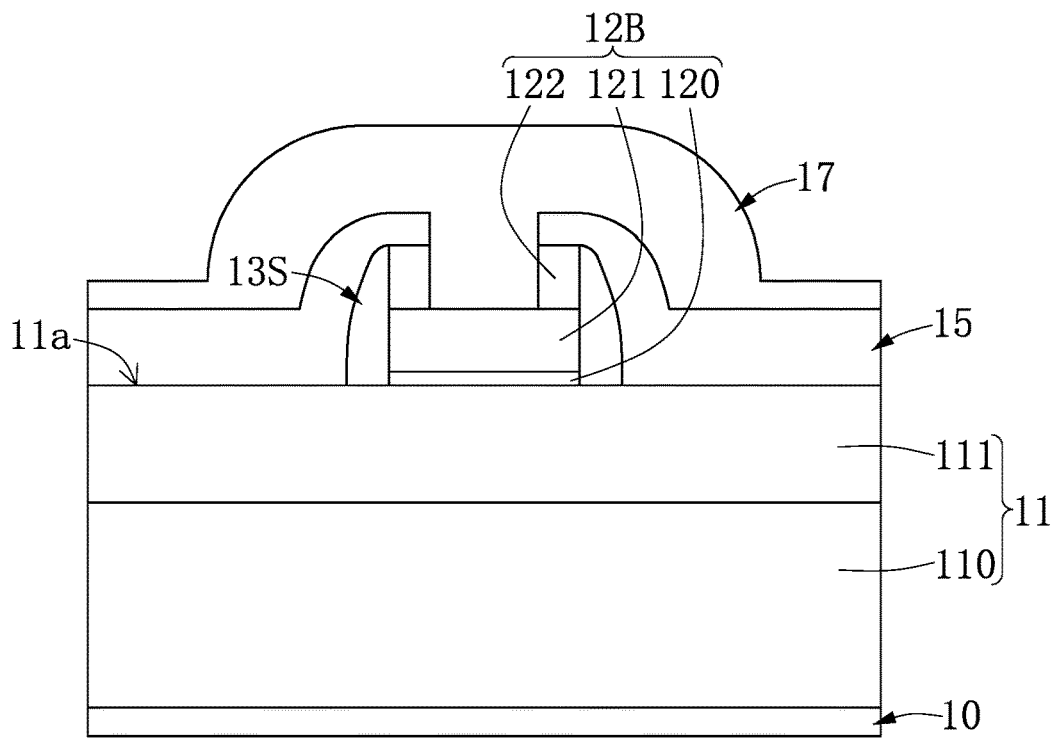
FIG. 4C is a schematic cross-sectional view taken along a line IVC-IVC of FIG. 4A.

Reference is made to FIG. 4A to FIG. 4C. FIG. 4A is a schematic top view partially showing a semiconductor power device in one of the steps according to an embodiment of the present disclosure. FIG. 4B is a schematic cross-sectional view taken along a line IVB-IVB of FIG. 4A. FIG. 4C is a schematic cross-sectional view taken along a line IVC-IVC of FIG. 4A.

As shown in FIG. 4A, a source conductive layer 16 and a gate conductive layer 17 are formed on the semiconductor layer 11 so as to be electrically connected to the source region 112 and the gate electrode 121, respectively. The source conductive layer 16 and the gate conductive layer 17 can be fabricated in the same deposition process. Furthermore, the gate conductive layer 17 and the source conductive layer 16 are spaced apart from each other.

As shown in FIG. 4A and FIG. 4B, the source conductive layer 16 is formed in the cell region AR and fills into the source contact opening 15S so as to be electrically connected to the source region 112. To be more specific, the source conductive layer 16 filled into the source contact opening 15S is electrically connected to the source region 112 by the silicide layer 14. As shown in FIG. 4C, a portion of the gate conductive layer 17 fills into the gate contact opening 15G and the extending hole 122H so as to be electrically connected to the gate electrode 121.

It is worth mentioning that, in the embodiment of the present disclosure, the interlayer dielectric layer 15 covers a part of the silicide layer 14. To be more specific, the silicide layer 14 extends toward the gate stacked structure 12 until the silicide layer 14 is in contact with the spacer 13S, i.e., the silicide layer 14 extends from a position under the source conductive layer 16 to another position under the interlayer dielectric layer 15.

Since the resistance of the silicide layer 14 is usually lower than that of the source region 112, the longer a horizontal distance between the silicide layer 14 and the channel region 113, the higher the on-resistance of the semiconductor power device M1. In the embodiment of the present disclosure, the shortest distance between the silicide layer 14 and the channel region 113 is related to the largest width D of the spacer 13S.

It should be noted that in the conventional technique for fabricating the conventional interconnection wires, after a formation of a dielectric layer, the dielectric layer is etched to define a plurality of contact windows respectively corresponding to a source region and a gate. Subsequently, by performing a self-aligned metal silicide process, the metal silicide layers are respectively formed on the source region and the gate. However, owing to the fabrication limitations and the interference of the dielectric layer, the area of the source region where the metal silicide layer is formed may be limited. Accordingly, it is difficult to shorten the shortest distance between the metal silicide layer and the channel region to less than 500 nm, such that the on-resistance of the conventional semiconductor power device cannot be further reduced.

Compared to the conventional processes, in the present disclosure, before the self-aligned silicide process is performed, the spacer 13S is formed to define the position for forming the silicide layer 14. Furthermore, the formation of the silicide layer 14 is carried out before the fabrication of the interconnection structure. As such, the shortest distance between the silicide layer 14 and the channel region 113 can be shortened to a range from 100 nm to 200 nm, thereby reducing the on-resistance and a conducting loss of the semiconductor power device M1.

Accordingly, as shown in FIG. 4A to FIG. 4C, the semiconductor power device M1 can also be provided in the embodiment of the present disclosure, The semiconductor device M1 includes the substrate 10, the semiconductor layer 11, the gate stacked structure 12, the spacer 13S, the silicide layer 14, and the interconnection structure.

The semiconductor layer 11 is disposed on the substrate 10 and has the body region 111 and the source region 112 formed therein, the source region 112 being formed in the body region 11. The source region 112 is connected to the upper surface 11a of the semiconductor layer 11, and an edge of the source region 112 and an edge of the body region 111 jointly define the channel region 113. The semiconductor layer 11 is divided into the cell region AR and the termination region TR.

The gate stacked structure 12 is disposed on the semiconductor layer 11 and overlaps with the channel region 113 in a vertical direction. As mentioned above, the gate stacked structure 12 includes the gate insulating layer 120, the gate electrode 121, and the mask layer 122, the mask layer 122 covering the gate electrode 121. Furthermore, the gate stacked structure 12 includes the first part 12A located in the cell region AR and the second part 12B located in the termination region TR.

The spacer 13S is disposed on the semiconductor layer 11 and covers the sidewall of the gate stacked structure 12. The spacer 13S has a largest thickness in a direction parallel to a width direction of the gate stacked structure 12, and the largest thickness ranges from 50 nm to 500 nm.

The silicide layer 14 is in contact with the source region 112, and the shortest distance between the silicide layer 14 and the channel region 113 ranges from 100 nm to 200 nm.

The interconnection structure includes the interlayer dielectric layer 15, the source conductive layer 16, and the gate conductive layer 17. The interlayer dielectric layer 15 has the source contact opening 15S and the gate contact opening 15G The position of the gate contact opening 15G corresponds to the second part 12B of the gate stacked structure 12.

The source conductive layer 16 is disposed on the interlayer dielectric layer 15 and in contact with the silicide layer 14 through the source contact opening 15S so as to be electrically connected to the source region 112. In the present embodiment, the silicide layer 14 extends from a position under the source conductive layer 16 to another position under the interlayer dielectric layer 15. That is to say, both of the interlayer dielectric layer 15 and the source conductive layer overlap with the silicide layer 14 in the vertical direction, while the spacer 13S and the silicide layer 14 do not overlap with each other in the vertical direction.

The gate conductive layer 17 is disposed on the interlayer dielectric layer 15 and electrically connected to the gate electrode 121 through the gate contact opening 15G and the extending hole 122H of the mask layer 122. In the present embodiment, the gate conductive layer 17 is located in the termination region TR and separate from the source conductive layer 16.

In conclusion, one of the advantages of the present disclosure is that in the semiconductor power device and the manufacturing method thereof provided herein, by "forming the spacer 13S covering the sidewall of the gate stacked structure 12 before the step of forming the interconnection structure and performing the self-aligned silicide process with the spacer 13S and the gate stacked structure 12 functioning as a mask," the shortest distance between the silicide layer 14 and the channel region 113 can be decreased. Since the silicide layer usually has a lower resistance than that of the source region 112, the on-resistance of the semiconductor power device M1 can be further reduced by decreasing the shortest distance between the silicide layer 14 and the channel region 113.

Furthermore, in the semiconductor power device of the embodiment of the present disclosure, the gate electrode 121 can be protected from contacting and reacting with the conductive layer 14' by the mask layer 122 when performing the self-aligned silicide process. As such, the melting and deformation of the gate electrode 121 due to the high temperature in the heat treatment can be prevented The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A manufacturing method of a semiconductor power device comprising:
    forming a semiconductor layer on a substrate, wherein the semiconductor layer includes a body region and a source region, the source region is located in the body region and connected to an upper surface of the semiconductor layer, and an edge of the source region and an edge of the body region jointly define a channel region therebetween, and the semiconductor layer is divided into a cell region and a termination region;
    forming a gate stacked structure on the semiconductor layer, the gate stacked structure overlapping with the channel region in a vertical direction, wherein the gate stacked structure includes a gate insulating layer, a gate electrode, and a mask layer covering the gate electrode, and the gate stacked structure is divided into a first part located in the cell region and a second part located in the termination region;
    forming at least one spacer covering a sidewall of the gate stacked structure, wherein a portion of the source region is covered by the at least one spacer, and another portion of the source region is exposed from the upper surface;
    performing a self-aligned silicide process with the spacer and the gate stacked structure functioning as a mask so as to form a silicide layer in contact with the exposed portion of the source region, wherein the silicide layer is not formed on the gate electrode during the self-aligned silicide process; and
    forming an interconnection structure on the semiconductor layer, wherein the interconnection structure includes an interlayer dielectric layer, a gate conductive layer and a source conductive layer that is electrically connected to the source region, wherein the interlayer dielectric layer has a gate contact opening corresponding to a position of the second part;
    wherein the mask layer of the second part disposed between the gate electrode and the interlayer dielectric layer has an extending hole connected to the gate contact opening, and the gate conductive layer is disposed on the second part and fills into the extending hole and the gate contact opening to be electrically connected to the gate electrode;
    wherein the silicide layer extends from a position under the source conductive layer toward the gate stacked structure to another position under the interlayer dielectric layer.

2. The manufacturing method according to claim 1, wherein the step of forming the gate stacked structure includes:
    forming a gate insulating material layer, an initial gate layer, and an initial mask layer on the upper surface of the semiconductor layer so as to form an initial gate stacked structure; and
    patterning the initial gate stacked structure so as to form the gate stacked structure and expose a part of the source region.

3. The manufacturing method according to claim 1, wherein the step of forming the interconnection structure includes:
    forming an interlayer dielectric material layer completely covering the silicide layer, the at least one spacer, and the gate stacked structure;
    patterning the interlayer dielectric material layer so as to form the interlayer dielectric layer having at least one source contact opening, wherein the silicide layer is exposed through the source contact opening; and
    forming the source conductive layer, wherein a portion of the source conductive layer fills into the source contact opening so that the source conductive layer is electrically connected to the source region by the silicide layer.

4. The manufacturing method according to claim 3, wherein the gate contact opening and the source contact opening are both formed by the step of patterning the interlayer dielectric material layer, and the step of forming the interconnection structure further includes:
    after the interlayer dielectric material layer is patterned, removing a portion of the mask layer through the gate contact opening so as to expose the gate electrode; and
    forming the gate conductive layer in the gate contact opening so that the gate conductive layer is electrically connected to the gate electrode, wherein the gate conductive layer and the source conductive layer are separated apart from each other.

5. The manufacturing method according to claim 1, wherein the step of forming the spacer includes:
    forming a dielectric material layer covering the upper surface of the semiconductor layer and the gate stacked structure; and
    performing an etching step to remove a portion of the dielectric material layer which is located on the gate stacked structure and the upper surface so as to form the at least one spacer.

6. The manufacturing method according to claim 1, wherein a thickness of the at least one spacer in a direction parallel to a width direction of the gate stacked structure gradually deceases along a direction from bottom to top.

7. The manufacturing method according to claim 1, wherein the self-aligned silicide process includes:
    forming a conductive layer completely covering the upper surface of the semiconductor layer, the at least one spacer and the gate stacked structure, wherein a portion of the conductive layer covering the gate stacked structure is isolated from the gate electrode by the mask layer;
    performing a heat treatment on the conductive layer so that another portion of the conductive layer, which is in contact with the semiconductor layer, reacts with the semiconductor layer to form the silicide layer, wherein the mask layer prevents the portion of the conductive layer covering on the gate stacked structure from reacting with the gate electrode; and
    removing another unreacted portion of the conductive layer.

8. A semiconductor power device comprising:
    a substrate;
    a semiconductor layer disposed on the substrate, wherein the semiconductor layer includes a body region and a source region, the source region is located in the body region and connected to an upper surface of the semiconductor layer, and an edge of the source region and an edge of the body region jointly define a channel region therebetween, and the semiconductor layer is divided into a cell region and a termination region;
    a gate stacked structure disposed on the upper surface of the semiconductor layer, wherein the gate stacked structure overlaps with the channel region in a vertical direction, the gate stacked structure includes a gate insulating layer, a gate electrode, and a mask layer covering the gate electrode, and the gate stacked structure is divided into a first part located in the cell region and a second part located in the termination region;

a spacer disposed on the semiconductor layer and covering a sidewall of the gate stacked structure, wherein the spacer covers a portion of the source region;

a silicide layer being in contact with the source region; and an interconnection structure including an interlayer dielectric layer, a gate conductive layer and a source conductive layer, wherein the interlayer dielectric layer at least has a source contact opening and a gate contact opening corresponding to a position of the second part, the source conductive layer is disposed on the interlayer dielectric layer and in contact with the silicide layer through the source contact opening so as to be electrically connected to the source region;

wherein the mask layer of the second part disposed between the gate electrode and the interlayer dielectric layer has an extending hole connected to the gate contact opening, and the gate conductive layer is disposed on the second part and fills into the extending hole and the gate contact opening to be electrically connected to the gate electrode;

wherein the silicide layer extends from a position under the source conductor layer toward the gate stacked structure to another position under the interlayer dielectric layer.

9. The semiconductor power device according to claim 8, wherein a thickness of the spacer in a direction parallel to a width direction of the gate stacked structure gradually decreases along a direction from bottom to top.

10. A manufacturing method of a semiconductor power device comprising:

forming a semiconductor layer on a substrate, wherein the semiconductor layer includes a body region and a source region, the source region is located in the body region and connected to an upper surface of the semiconductor layer, and an edge of the source region and an edge of the body region jointly define a channel region therebetween;

forming a gate stacked structure on the semiconductor layer, the gate stacked structure overlapping with the channel region in a vertical direction, wherein the gate stacked structure includes a gate insulating layer, a gate electrode, and a mask layer covering the gate electrode;

forming at least one spacer covering a sidewall of the gate stacked structure, wherein a portion of the source region is covered by the at least one spacer, and another portion of the source region is exposed from the upper surface;

performing a self-aligned silicide process with the spacer and the gate stacked structure functioning as a mask so as to form a silicide layer in contact with the exposed portion of the source region, wherein the silicide layer is not formed on the gate electrode by the mask layer covering the gate electrode during the self-aligned silicide process; and forming an interconnection structure on the semiconductor layer, wherein the interconnection structure includes an interlayer dielectric layer and a source conductive layer that is electrically connected to the source region;

wherein a portion of the mask layer is not removed and remains between the gate electrode and the interlayer dielectric layer after the step of forming the interconnection structure; and wherein the silicide layer extends from a position under the source conductive layer toward the gate stacked structure to another position under the interlayer dielectric layer.

* * * * *